US011239331B2

United States Patent
Ma et al.

(10) Patent No.: US 11,239,331 B2
(45) Date of Patent: Feb. 1, 2022

(54) THIN FILM TRANSISTOR SUBSTRATE AND METHOD OF FABRICATING SAME (71) Applicant: SHENZHEN CHINA STAR OPTOELECTRONICS SEMICONDUCTOR DISPLAY TECHNOLOGY CO., LTD., Shenzhen (CN)

(72) Inventors: Qian Ma, Shenzhen (CN); Xingyu Zhou, Shenzhen (CN)

( * ) Notice: Subject to any disclaimer, the term of this patent is extended or adjusted under 35 U.S.C. 154(b) by 206 days.

(21) Appl. No.: 16/619,736

(22) PCT Filed: Oct. 24, 2019

(86) PCT No.: PCT/CN2019/113014
§ 371 (c)(1),
(2) Date: Dec. 5, 2019

(87) PCT Pub. No.: WO2021/012435
PCT Pub. Date: Jan. 28, 2021

(65) Prior Publication Data
US 2021/0336018 A1 Oct. 28, 2021

(30) Foreign Application Priority Data

Jul. 19, 2019 (CN) .......................... 201910654433.1

(51) Int. Cl.
H01L 29/417 (2006.01)
H01L 29/786 (2006.01)
H01L 29/66 (2006.01)
H01L 29/40 (2006.01)

(52) U.S. Cl.
CPC ...... *H01L 29/41733* (2013.01); *H01L 29/401* (2013.01); *H01L 29/66969* (2013.01); *H01L 29/786* (2013.01); *H01L 29/78681* (2013.01)

(58) Field of Classification Search
CPC ............. H01L 29/41733; H01L 29/401; H01L 29/66969; H01L 29/786; H01L 29/78681
USPC .......................................................... 257/66
See application file for complete search history.

(56) References Cited

U.S. PATENT DOCUMENTS

| 2016/0049523 | A1* | 2/2016 | Yamada | .............. H01L 29/4908 250/370.08 |
| 2016/0359053 | A1 | 12/2016 | Wang et al. | |
| 2019/0074383 | A1* | 3/2019 | Yu | ......................... G09G 3/3208 |
| 2019/0229017 | A1* | 7/2019 | Liu | ..................... H01L 29/7869 |

FOREIGN PATENT DOCUMENTS

| CN | 104900531 A | 9/2015 |
| JP | 2007288122 A | 11/2007 |

* cited by examiner

Primary Examiner — Tong-Ho Kim
(74) Attorney, Agent, or Firm — JMB Davis Ben-David (57) ABSTRACT A thin film transistor substrate and a method of fabricating same are provided.
The thin film transistor substrate includes a substrate, a light shielding layer disposed on the substrate, a buffer layer disposed on the light shielding layer, an active layer disposed on the buffer layer, and a gate insulating layer disposed on the active layer. The gate insulating layer includes a stacked structure including a first insulating layer and a second insulating layer.

4 Claims, 6 Drawing Sheets

THIN FILM TRANSISTOR SUBSTRATE AND METHOD OF FABRICATING SAME

CROSS-REFERENCE TO RELATED APPLICATIONS

This is the U.S. National Stage of International Patent Application No. P PCT/CN2019/113014, filed Oct. 24, 2019, which in turn claims the benefit of Chinese Patent Application No. 201910654433.1, filed Jul. 19, 2019.

FIELD OF INVENTION

The present disclosure relates to the field of display panel technologies, and more particularly to a thin film transistor substrate and a method of fabricating the same.

BACKGROUND OF INVENTION

In the field of display technologies, flat panel display devices such as liquid crystal displays (LCDs) and organic light emitting diode (OLED) displays have gradually replaced cathode display screens, are widely used in mobile phones, televisions, personal digital assistants, digital cameras, notebook computers, desktop computers, and other consumer electronic products, and have become the mainstream in display devices.

Generally, a liquid crystal display panel includes a color filter (CF) substrate, a thin film transistor (TFT) substrate, a liquid crystal (LC) layer sandwiched between the color filter substrate and the thin film transistor substrate, and a sealant frame, and a molding process thereof generally includes an front array process (including film, yellow light, etching, and stripping processes), a middle cell process (including bonding the thin film transistor substrate and the color film substrate), and a back module assembly process (including pressing a drive integrated circuit and a printed circuit board). In a fabrication process of the thin film transistor substrate, a top gate of a self-aligned oxide semiconductor thin film transistor substrate uses silicon dioxide (SiO2) as a gate insulating layer. A bias voltage is applied to the thin film transistor substrate due to an introduction of defects during a deposition of silicon dioxide. Characteristics of the thin film transistor substrate are greatly affected, and this results in poor reliability of the thin film transistor substrate.

Therefore, it is necessary to invent a new method of fabricating a thin film transistor substrate to solve the above issues.

SUMMARY OF INVENTION

In order to achieve the above object, an embodiment of the present disclosure provides a thin film transistor substrate. The thin film transistor substrate includes a substrate, a light shielding layer disposed on the substrate, a buffer layer disposed on the light shielding layer, an active layer disposed on the buffer layer, and a gate insulating layer disposed on the active layer. The gate insulating layer includes a stacked structure including a first insulating layer and a second insulating layer, a thickness of the first insulating layer is not less than a thickness of the second insulating layer, and the second insulating layer is disposed on the first insulating layer.

In an embodiment of the present disclosure, the thin film transistor substrate includes a gate layer disposed on the gate insulating layer, a conductor layer including a first conductor layer and a second conductor layer, respectively disposed at two ends of the active layer, an interlayer insulating layer disposed on the gate layer, at least one via hole disposed in the interlayer insulating layer and the buffer layer, a source/drain metal layer disposed in the at least one via hole, and a passivation layer disposed on the source/drain metal layer.

In an embodiment of the present disclosure, the at least one via hole includes a first via hole, a second via hole, and a third via hole, the first via hole is connected to the first conductor layer through the interlayer insulating layer, the second via hole is connected to the second conductor layer through the interlayer insulating layer, and the third via hole is connected to the light shielding layer through the interlayer insulating layer and the buffer layer sequentially.

In an embodiment of the present disclosure, the source/drain metal layer includes a source metal layer and a drain metal layer, the source metal layer is disposed in the second via hole and the third via hole, and the drain metal layer is disposed in the first via hole.

An embodiment of the present disclosure further provides a method of fabricating a thin film transistor substrate including steps of: S1, providing a substrate, sequentially forming a light shielding layer, a buffer layer, and an active layer on the substrate, S2, forming a gate insulating layer on the active layer, wherein the gate insulating layer includes a stacked structure comprising a first insulating layer and a second insulating layer, a thickness of the first insulating layer is not less than a thickness of the second insulating layer, and the second insulating layer is disposed on the first insulating layer, S3, sequentially forming a metal layer and a photoresist layer on the gate insulating layer, S4, etching the metal layer by using the photoresist layer as an occlusion to obtain a gate layer, and removing a portion of the metal layer that is not blocked by the photoresist layer, S5, etching the gate insulating layer by self-aligning the gate layer, and performing a conductor treatment, wherein the active layer not blocked by the gate insulating layer forms a conductor layer, and S6, after the gate insulating layer is etched and the conductor treatment is completed, the photoresist layer is stripped.

In an embodiment of the present disclosure, the method further includes steps of: S7, forming an interlayer insulating layer on the gate layer, S8, opening at least one hole in the interlayer insulating layer and the buffer layer to form at least one via hole, S9, forming a source/drain metal layer in the at least one via hole, and S10, forming a passivation layer on the source/drain metal layer.

In an embodiment of the present disclosure, the at least one via hole is formed by a yellow light process, the at least one via hole includes a first via hole, a second via hole, and a third via hole, the first via hole is connected to a first conductor layer through the interlayer insulating layer, the second via hole is connected to a second conductor layer through the interlayer insulating layer, and the third via hole is connected to the light shielding layer through the interlayer insulating layer and the buffer layer sequentially.

In an embodiment of the present disclosure, the source/drain metal layer includes a source metal layer and a drain metal layer, the source metal layer is formed in the second via hole and the third via hole, and the drain metal layer is formed in the first via hole.

In an embodiment of the present disclosure, the light shielding layer, the gate layer, and the source/drain metal layer are made of the same material which is at least one of molybdenum, aluminum, copper, and titanium, a thickness of the light shielding layer ranges between 500 angstroms and 2000 angstroms, the gate layer and the source/drain metal layer have the same thickness ranging between 2000 angstroms and 8000 angstroms, material of the active layer includes a metal oxide semiconductor material, and a thickness of the active layer ranges between 100 angstroms and 1000 angstroms.

In an embodiment of the present disclosure, the buffer layer, the interlayer insulating layer, and the passivation layer are made of the same material which is at least one of silicon oxide and silicon nitride, a thickness of the interlayer insulating layer ranges between 2000 angstroms and 10000 angstroms, and the buffer layer and the passivation layer have the same thickness ranging between 1000 angstroms and 5000 angstroms.

Beneficial effects of an embodiment of the present disclosure are that, a thin film transistor substrate and a method of fabricating the same are provided. The gate insulating layer adopts a two-layer structure, one layer is a silicon oxide layer, and another layer is a silicon nitride layer. The silicon oxide layer is formed on the active layer, and the silicon nitride layer is formed on the silicon oxide layer. Hydrogen ions in the silicon nitride layer diffuse into the active layer, hindering trapping of electrons by the defect state, reducing influence of a bias stress on characteristics of the thin film transistor substrate, and improving reliability of the thin film transistor substrate. In addition, silicon nitride has a high dielectric constant, which can improve field effect mobility of the thin film transistor substrate.

DESCRIPTION OF DRAWINGS

In order to more clearly illustrate the embodiments or the technical solutions in the prior art, the drawings used in the embodiments or the description of the prior art will be briefly described below. Obviously, the drawings in the following description are only for the application. For some embodiments, other drawings may be obtained from those of ordinary skill in the art without departing from the drawings.

DETAILED DESCRIPTION OF PREFERRED EMBODIMENTS

The technical solutions in the embodiments of the present invention are clearly and completely described in the following with reference to the accompanying drawings in the embodiments of the present invention. It is obvious that the described embodiments are only a part of the embodiments of the present invention, but not all embodiments. All other embodiments obtained by a person skilled in the art based on the embodiments of the present invention without creative efforts are within the scope of the present invention.

In the description of the present application, it is to be understood that the terms of the orientation or positional relationship of the indications terms "center", "longitudinal", "transverse", "length", "width", "thickness", "upper", "lower", "front", "back", "left", "right", "vertical", "horizontal", "top", "bottom", "inner", "outer", "clockwise", "counterclockwise", and the like are based on the orientation or positional relationship shown in the drawings, and are merely for convenience of description of the present application and simplified description, and do not indicate or imply that the indicated device or the components must have a particular orientation, constructed and operated in a particular orientation, and thus are not to be construed as limiting.

Moreover, the terms "first" and "second" are used for descriptive purposes only and are not to be understood as indicating or implying a relative importance or implicitly indicating the number of technical features indicated. Thus, features defining "first" and "second" may include one or more of the features either explicitly or implicitly. In the description of the present application, "a plurality" means two or more unless otherwise stated.

A thin film transistor substrate and a method of fabricating the same according to an embodiment of the present invention will be described below with reference to FIG. 1 to FIG. 14.

Figure 1:
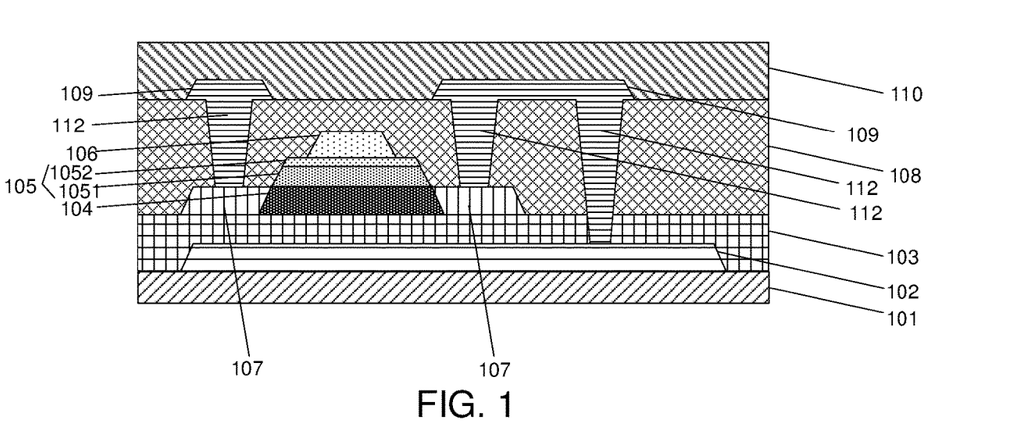
FIG. 1 is a schematic structural view of a thin film transistor substrate according to an embodiment of the present invention.
Figure 2:
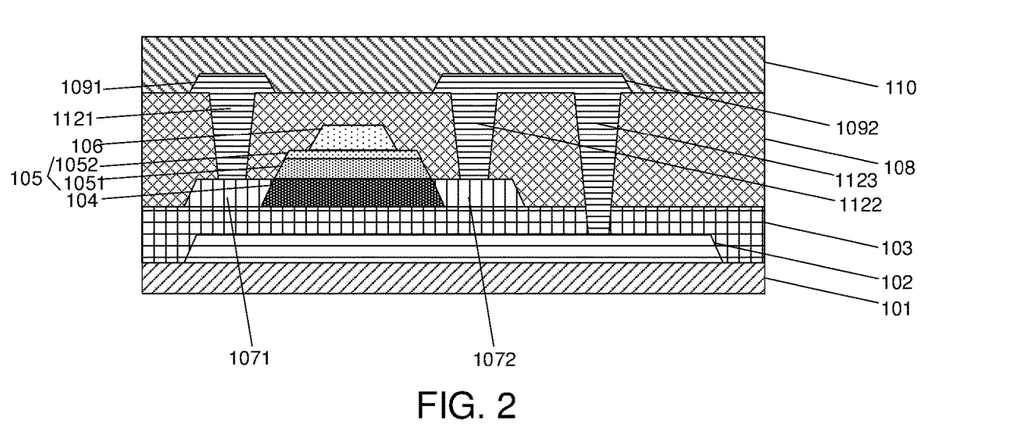
FIG. 2 is a schematic view showing a specific structure of a thin film transistor substrate according to an embodiment of the present invention.

An embodiment of the present invention provides a thin film transistor substrate. FIG. 1 and FIG. 2 are schematic structural views showing a thin film transistor substrate according to an embodiment of the present invention. The thin film transistor substrate includes a substrate 101, a light shielding layer 102, a buffer layer 103, an active layer 104, a gate insulating layer 105, a gate layer 106, a conductor layer 107, an interlayer insulating layer 108, a source/drain metal layer 109, a passivation layer 110, and at least one via hole 112.

The substrate 101 is a bottom of the thin film transistor substrate. The substrate 101 is, for example but not limited to, a glass substrate.

The light shielding layer 102 is formed on an upper surface of the substrate 101. In the embodiment, the light shielding layer 102 has a trapezoidal shape and covers only a part of the upper surface of the substrate 101. Material of the light shielding layer 102 is a metal material. In the embodiment, the material of the light shielding layer 102 is specifically one of molybdenum (Mo), aluminum (Al), copper (Cu), and titanium (Ti) or an alloy. A thickness of the light shielding layer 102 ranges between 500 angstroms and 2000 angstroms.

The buffer layer 103 is formed on the upper surface of the light shielding layer 102. In the embodiment, the buffer layer 103 covers the upper surface of the light shielding layer 102 and the portion of the upper surface of the substrate 101 that is not covered by the light shielding layer 102. In the embodiment, material of the buffer layer 103 is a combination of one or two of silicon oxide and silicon nitride, or a multilayer structure film, and the buffer layer 103 has a thickness of 1000 to 5000 angstroms.

The active layer 104 is formed on the upper surface of the buffer layer 103. In the embodiment, the active layer 104 has a trapezoidal shape and covers only a portion of the upper surface of the buffer layer 103. The material of the active layer 104 is a metal oxide semiconductor material. In this embodiment, the material of the active layer 104 is indium gallium zinc oxide (IGZO), indium zinc tin oxide (IZTO), or indium gallium zinc tin oxide (IGZTO). The active layer 104 has a thickness of 100 to 1000 angstroms.

The gate insulating layer 105 is formed on the upper surface of the active layer 104. The gate insulating layer 105 has a stacked structure. In this embodiment, the gate insulating layer 105 has a two-layer structure, and one layer of the gate insulating layer 105 is a first insulating layer 1051. In this embodiment, specifically, a silicon oxide layer (SiOx) 1051 is used. Another layer of the gate insulating layer 105 is a second insulating layer 1052, which is specifically a silicon nitride layer (SiNx) 1052 in this embodiment. Specifically, in the embodiment, the silicon oxide layer 1051 is formed on the upper surface of the active layer 104, and the silicon oxide layer 1051 covers the upper surface of the active layer 104. The silicon nitride layer 1052 is formed on the upper surface of the silicon oxide layer 1051, and the silicon nitride layer 1052 covers the upper surface of the silicon oxide layer 1051. Hydrogen ions in silicon nitride of the silicon nitride layer 1052 diffuse into the active layer 104, thereby hindering trapping of electrons by the defect state, reducing influence of a bias stress on characteristics of the thin film transistor substrate, and improving reliability of the thin film transistor substrate. In addition, a dielectric constant of silicon nitride is high, and field effect mobility of the thin film transistor substrate can be improved at about 8 Farads per meter (F·m−1). The thickness of the silicon oxide layer 1051 is not less than that of the silicon nitride layer 1052. In the embodiment, the silicon oxide layer 1051 has a thickness of 1000 angstroms to 2000 angstroms, and the silicon nitride layer 1052 has a thickness of 500 angstroms to 1000 angstroms.

The gate layer 106 is formed on the upper surface of the gate insulating layer 105. In the embodiment, the gate layer 106 has a trapezoidal shape covering a portion of the upper surface of the gate insulating layer 105, that is, a portion of the upper surface of the silicon nitride layer 1052. The material of the gate layer 106 is a metal material. In the embodiment, the material of the gate layer 106 is specifically one of molybdenum (Mo), aluminum (Al), copper (Cu), and titanium (Ti) or an alloy. The gate layer 106 has a thickness of 2000 to 8000 angstroms.

As shown in FIG. 1 and FIG. 2, the conductor layer 107 includes a first conductor layer 1071 and a second conductor layer 1072. After the active layer 104 is subjected to a conductor treatment, an intermediate portion of the active layer 104 is protected by the gate insulating layer 105, and original characteristics of the active layer 104 are maintained as a thin film transistor channel. The resistance of the active layer 104 is significantly reduced, and the conductive layer 107 of heavily doped nitrogen is formed. One end of the active layer 104 corresponds to the first conductor layer 1071, and the other end of the active layer 104 corresponds to the second conductor layer 1072.

The interlayer insulating layer 108 is formed on the gate layer 106. The interlayer insulating layer 108 covers an upper surface of the gate layer 106, a portion of the upper surface of the gate insulating layer 105 that is not covered by the gate layer 106, an upper surface of the conductor layer 107, and an uncovered portion of the upper surface of the buffer layer 3. In the embodiment, the material of the interlayer insulating layer 108 is a combination of one or two of silicon oxide and silicon nitride, and the thickness of the interlayer insulating layer 108 is 2,000 to 10,000 angstroms.

As shown in FIG. 1 and FIG. 2, the at least one via hole 112 includes a first via hole 1121, a second via hole 1122, and a third via hole 1123. The first via hole 1121 is for accommodating a drain metal layer 1091, and the second via hole 1122 and the third via hole 1123 are for accommodating a source metal layer 1092. The first via hole 1121 and the second via hole 1122 are formed on the conductor layer 107. The first via hole 1121 is connected to an upper surface of the first conductor layer 1071 through the interlayer insulating layer 108, the second via hole 1122 is connected to the upper surface of the second conductor layer 1072 through the interlayer insulating layer 108, and the third via hole 1123 is formed on the light shielding layer 102. The third via hole 1123 is connected to the upper surface of the light shielding layer 102 through the interlayer insulating layer 108 and the buffer layer 103 in order from top to bottom.

A source/drain metal layer 109 is formed in the via hole 112. In this embodiment, the material of the source/drain metal layer 109 is one of molybdenum (Mo), aluminum (Al), copper (Cu), and titanium (Ti) an alloy. A thickness of the source/drain metal layer 109 ranges between 2000 angstroms and 8000 angstroms. As shown in FIGS. 1 and 2, the source/drain metal layer 109 includes a source metal layer 1092 and a drain metal layer 1091. The source metal layer 1092 is correspondingly deposited in the second via hole 1122 and the third via hole 1123, and the two bottom ends thereof are respectively connected to the upper surface of the conductor layer 107 and the light shielding layer 102. The top end of the source metal layer 1092 overflows the second via hole 1122 and the third via hole 1123, and is formed on the upper surface of the interlayer insulating layer 108. The drain metal layer 1091 is correspondingly deposited in the first via hole 1121, and the bottom end thereof is in contact with the upper surface of the conductor layer 107. The top end of the drain metal layer 1091 overflows the first via hole 1121 and is formed on the upper surface of the interlayer insulating layer 108.

The passivation layer 110 is formed on the upper surface of the interlayer insulating layer 108. The passivation layer 110 covers the upper surface of the interlayer insulating layer 108 and the upper surface of the source/drain metal layer 109. In the embodiment, the material of the passivation layer 110 is a combination of one or two of silicon oxide and silicon nitride, or a multilayer structure film, and the passivation layer 110 has a thickness of 1000 to 5000 angstroms.

Figure 3:
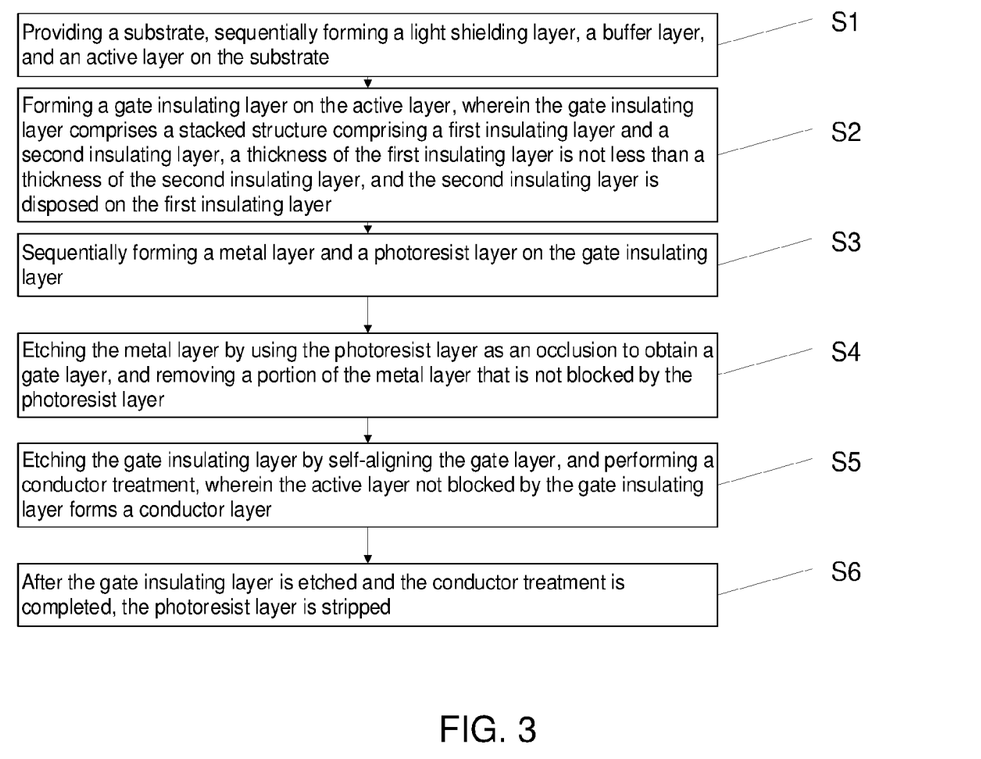
FIG. 3 is a schematic flowchart showing a method of fabricating a thin film transistor substrate according to an embodiment of the invention.
Figure 4:
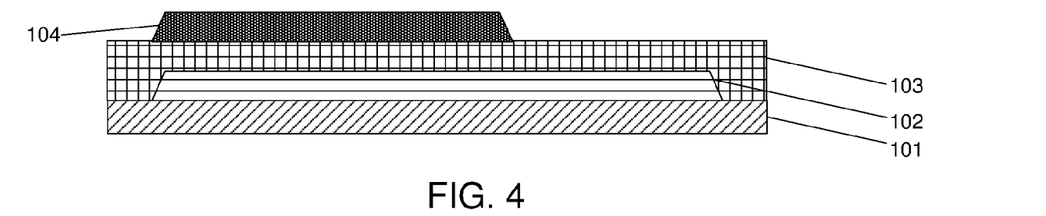
FIG. 4 is a schematic structural view showing a step S1 of the method of fabricating the thin film transistor substrate of FIG. 3.

An embodiment of the present invention also provides a method for fabricating a thin film transistor substrate. FIG. 3 is a schematic flowchart of a method for fabricating a thin film transistor substrate according to an embodiment of the present invention. The method for fabricating the thin film transistor substrate includes the following steps:

S1, a substrate 101 is provided, and a light shielding layer 102, a buffer layer 103, and an active layer 104 are sequentially formed on the substrate 101.

As shown in FIG. 4, a substrate 101 is provided as a bottom of a thin film transistor, and the substrate 101 is, for example but not limited to, a glass substrate.

After the substrate 101 is cleaned, a metal layer is formed on the upper surface of the substrate 101, patterned by a yellow light process and etching, and a patterned metal layer is used as the light shielding layer 102. The light shielding layer 102 has a trapezoidal shape and covers only a part of the upper surface of the substrate 101. The material of the light shielding layer 102 is a metal material. In the embodiment, the material of the light shielding layer 102 is specifically one of molybdenum (Mo), aluminum (Al), copper (Cu), and titanium (Ti) or an alloy. The light shielding layer 102 has a thickness of 500 to 2000 angstroms.

The buffer layer 103 is formed on the upper surface of the light shielding layer 102. In the embodiment, the buffer layer 103 covers the upper surface of the light shielding layer 102 and the portion of the upper surface of the substrate 101 that is not covered by the light shielding layer 102. In the embodiment, material of the buffer layer 103 is a combination of one or two of silicon oxide and silicon nitride, or a multilayer structure film, and the buffer layer 103 has a thickness of 1000 to 5000 angstroms.

The active layer 104 is formed on the upper surface of the buffer layer 103. In the embodiment, the active layer 104 has a trapezoidal shape and covers only a portion of the upper surface of the buffer layer 103. The material of the active layer 104 is a metal oxide semiconductor material. In this embodiment, the material of the active layer 104 is indium gallium zinc oxide (IGZO), indium zinc tin oxide (IZTO), or indium gallium zinc tin oxide (IGZTO). The active layer 104 has a thickness of 100 to 1000 angstroms.

Figure 5:
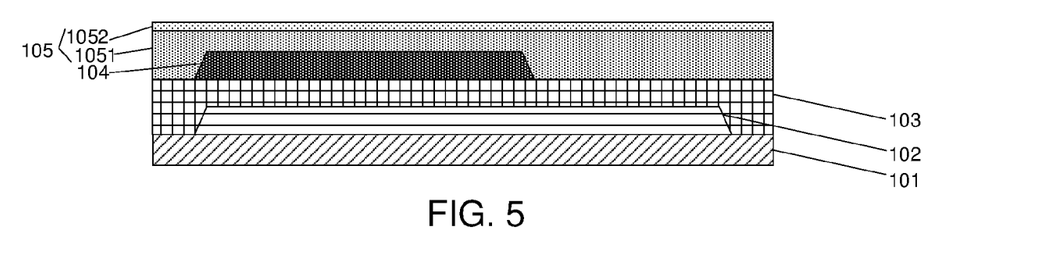
FIG. 5 is a schematic structural view showing a step S2 of the method of fabricating the thin film transistor substrate of FIG. 3.

S2, a gate insulating layer 105 is formed on the active layer 104. The gate insulating layer 105 has a stacked structure including a first insulating layer 1051 and a second insulating layer 1052, a thickness of the first insulating layer 1051 is not less than that of the second insulating layer 1052, and the second insulating layer 1052 is formed on the first insulating layer 1051.

As shown in FIG. 5, the gate insulating layer 105 is formed on the upper surface of the active layer 104. The gate insulating layer 105 has a stacked structure. In this embodiment, the gate insulating layer 105 has a two-layer structure, and one layer of the gate insulating layer 105 is a first insulating layer 1051. In this embodiment, specifically, a silicon oxide layer (SiOx) 1051 is used. Another layer of the gate insulating layer 105 is a second insulating layer 1052, which is specifically a silicon nitride layer (SiNx) 1052 in this embodiment. Specifically, in the embodiment, the silicon oxide layer 1051 is formed on the upper surface of the active layer 104, and the silicon oxide layer 1051 covers the upper surface of the active layer 104. The silicon nitride layer 1052 is formed on the upper surface of the silicon oxide layer 1051, and the silicon nitride layer 1052 covers the upper surface of the silicon oxide layer 1051. Hydrogen ions in silicon nitride of the silicon nitride layer 1052 diffuse into the active layer 104, thereby hindering trapping of electrons by the defect state, reducing influence of a bias stress on characteristics of the thin film transistor substrate, and improving reliability of the thin film transistor substrate. In addition, a dielectric constant of silicon nitride is high, and field effect mobility of the thin film transistor substrate can be improved at about 8 Farads per meter (F·m−1). The thickness of the silicon oxide layer 1051 is not less than that of the silicon nitride layer 1052. In the embodiment, the silicon oxide layer 1051 has a thickness of 1000 angstroms to 2000 angstroms, and the silicon nitride layer 1052 has a thickness of 500 angstroms to 1000 angstroms.

Figure 6:
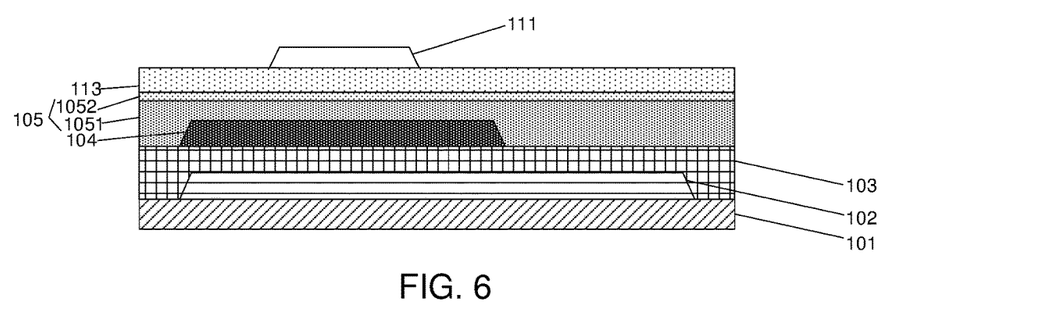
FIG. 6 is a schematic structural view showing a step S3 of the method for fabricating the thin film transistor substrate of FIG. 3.

S3, a metal layer 113 and a photoresist layer 111 are sequentially formed on the gate insulating layer 105.

As shown in FIG. 6, the metal layer 113 is deposited on the upper surface of the gate insulating layer 105, and the metal layer 113 covers the upper surface of the gate insulating layer 105. The material of the metal layer 113 is a metal material. In the embodiment, the material of the metal layer 113 is specifically one of molybdenum (Mo), aluminum (Al), copper (Cu), and titanium (Ti) or an alloy. The gate layer 106 has a thickness of 2000 to 8000 angstroms. An entire photoresist layer 111 is deposited on the upper surface of the metal layer 113. After the entire photoresist layer 111 is exposed and developed, the photoresist layer 111 having a trapezoidal shape as shown in FIG. 5 is formed. In this embodiment, the trapezoidal photoresist layer 111 covers only a portion of the upper surface of the gate layer 106.

Figure 7:
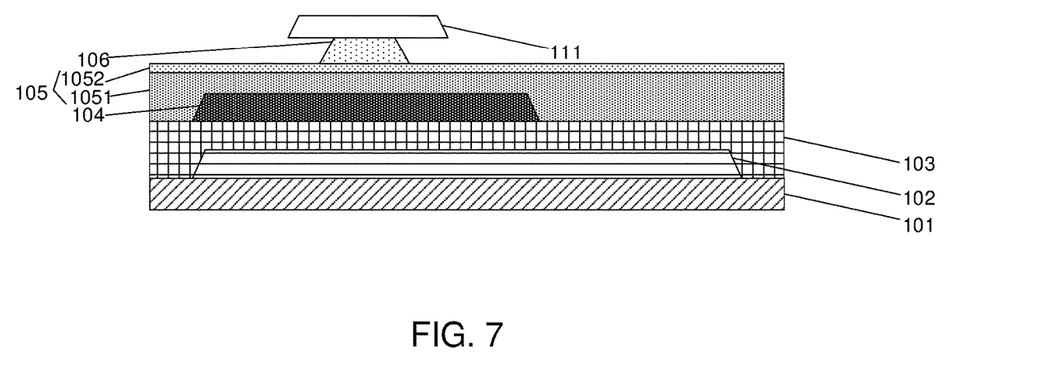
FIG. 7 is a schematic structural view showing a step S4 of the method of fabricating the thin film transistor substrate of FIG. 3.

S4, etching the metal layer 113 by using the photoresist layer 111 as a mask to obtain a gate layer 106, and removing a portion of the metal layer 113 that is not blocked by the photoresist layer 111 is provided.

As shown in FIG. 7, the photoresist layer 111 is shielded by a yellow light process, and the metal layer 113 is etched to remove portions of the metal layer 113 that are not blocked by the photoresist layer 111, and the gate layer 106 is obtained after etching. In the embodiment, the gate layer 106 obtained after etching has a trapezoidal shape covering a portion of the upper surface of the gate insulating layer 105, that is, a portion covering the upper surface of the silicon nitride layer 1052. The material of the gate layer 106 is a metal material. In the embodiment, the material of the gate layer 106 is specifically one of molybdenum (Mo), aluminum (Al), copper (Cu), and titanium (Ti) or an alloy. The gate layer 106 has a thickness of 2000 to 8000 angstroms.

Figure 8:
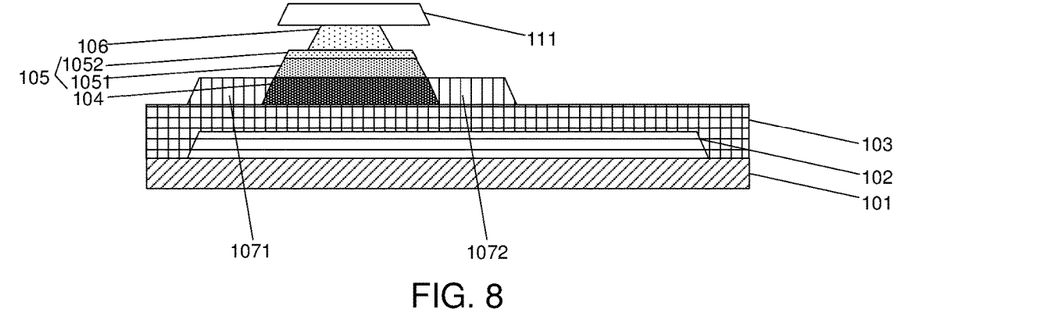
FIG. 8 is a schematic structural view showing a step S5 of the method of fabricating the thin film transistor substrate of FIG. 3.

S5, etching the gate insulating layer 105 by self-aligning the gate layer 106, and performing a conductor treatment, wherein the active layer 104 not blocked by the gate insulating layer 105 forms a conductor layer 107 is provided.

As shown in FIG. 8, the gate insulating layer 105 is etched by self-aligning the gate layer 106. Only under the film layer of the gate layer 106, the gate insulating layer 105 is present, and the remaining gate insulating layer 105 is etched away. In addition, an entire surface of the active layer 104 is subjected to a conductor treatment, and after the active layer 104 is subjected to the conductor treatment, an intermediate portion of the active layer 104 is protected by the gate insulating layer 105, and original characteristics of the active layer 104 are maintained as a thin film transistor channel. The resistance of the active layer 104 is significantly reduced, and the conductive layer 107 of heavily doped nitrogen is formed. One end of the active layer 104 corresponds to the first conductor layer 1071, and the other end of the active layer 104 corresponds to the second conductor layer 1072.

Figure 9:
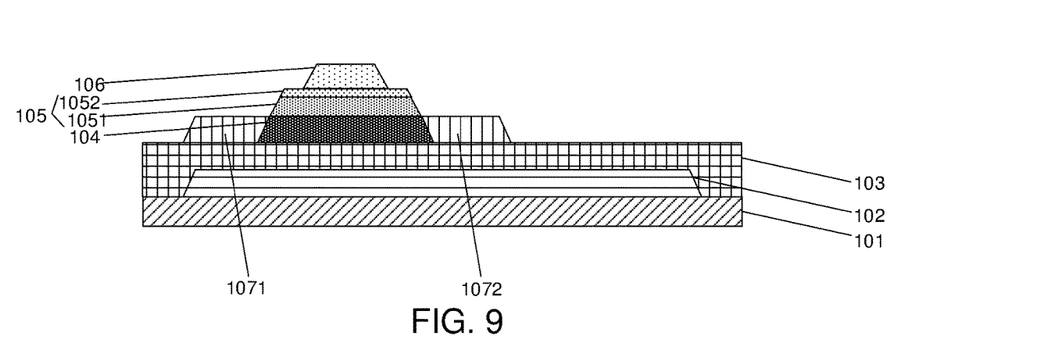
FIG. 9 is a schematic structural view showing a step S6 of the method for fabricating the thin film transistor substrate of FIG. 3.

S6, after the gate insulating layer 105 is etched and the conductor treatment is completed, the photoresist layer 111 is stripped.

As shown in FIG. 9, after the step S6 is completed, that is, after the gate insulating layer 105 is etched and the conductor treatment of the active layer 104 is completed, the photoresist layer 111 provided on the upper surface of the gate layer 106 is peeled off.

Figure 10:
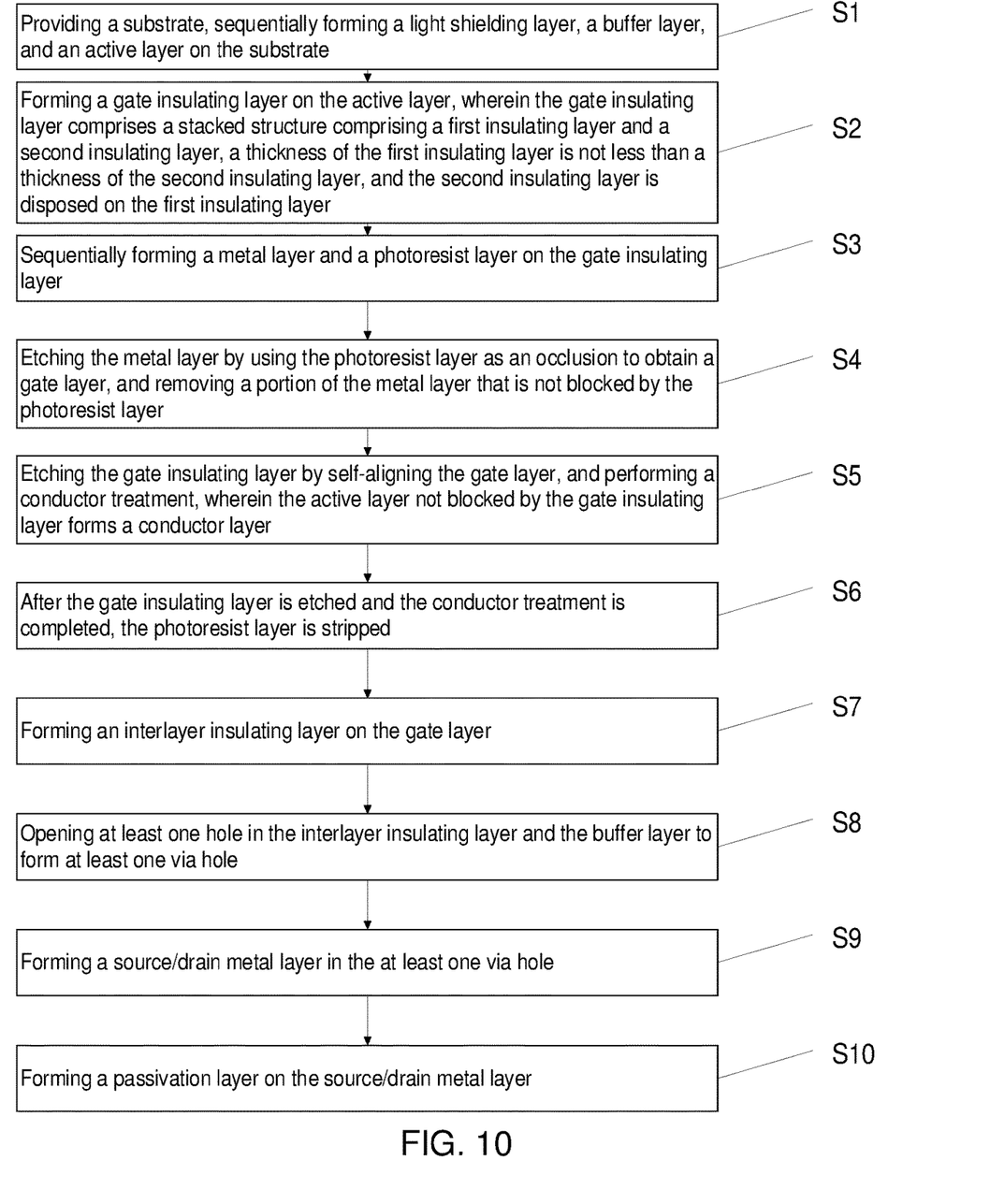
FIG. 10 is a flowchart showing a method of fabricating a thin film transistor substrate according to another embodiment of the present invention.
Figure 11:
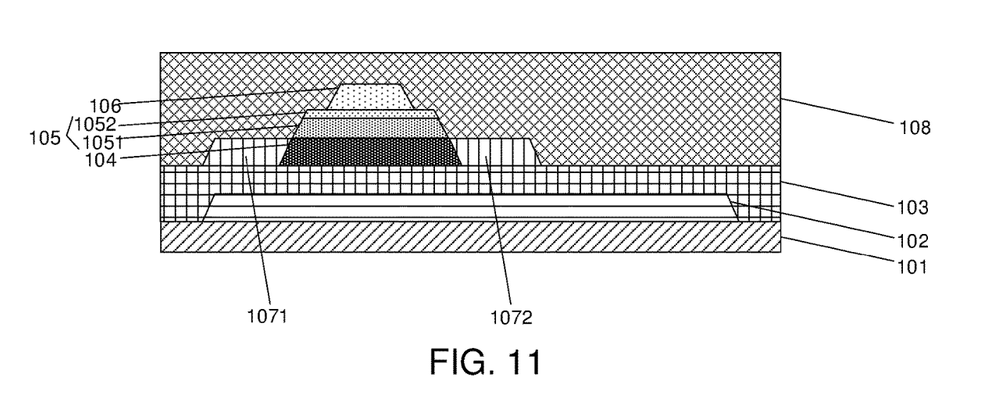
FIG. 11 is a schematic structural view showing a step S7 of the method of fabricating the thin film transistor substrate of FIG. 10.

Further, as shown in FIG. 10, the method for fabricating the thin film transistor substrate according to another embodiment of the present invention further includes the following steps:

S7, forming an interlayer insulating layer 108 on the gate layer 106 is provided.

As shown in FIG. 11, the interlayer insulating layer 108 is formed on the gate layer 106. The interlayer insulating layer 108 covers an upper surface of the gate layer 106, a portion of the upper surface of the gate insulating layer 105 that is not covered by the gate layer 106, an upper surface of the conductor layer 107, and an uncovered portion of the upper surface of the buffer layer 3. In the embodiment, the material of the interlayer insulating layer 108 is a combination of one or two of silicon oxide and silicon nitride, and the thickness of the interlayer insulating layer 108 is 2,000 to 10,000 angstroms.

Figure 12:
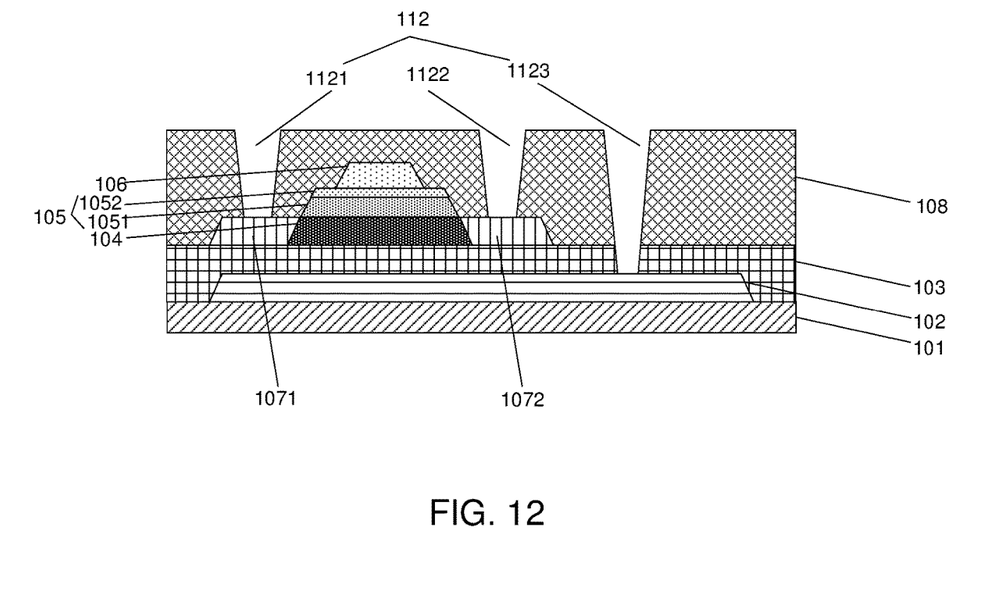
FIG. 12 is a schematic structural view showing a step S8 of the method of fabricating the thin film transistor substrate of FIG. 10.

S8, opening at least one hole in the interlayer insulating layer 108 and the buffer layer 103 to form at least one via hole 112 is provided.

As shown in FIG. 12, the interlayer insulating layer 108 and the buffer layer 103 are opened by a yellow light process to form at least one via hole 112 of the thin film transistor substrate. The at least one via hole 112 includes a first via hole 1121, a second via hole 1122, and a third via hole 1123. The first via hole 1121 is for accommodating a drain metal layer 1091, and the second via hole 1122 and the third via hole 1123 are for accommodating a source metal layer 1092. The first via hole 1121 and the second via hole 1122 are formed on the conductor layer 107. The first via hole 1121 is connected to an upper surface of the first conductor layer 1071 through the interlayer insulating layer 108, the second via hole 1122 is connected to the upper surface of the second conductor layer 1072 through the interlayer insulating layer 108, and the third via hole 1123 is formed on the light shielding layer 102. The third via hole 1123 is connected to the upper surface of the light shielding layer 102 through the interlayer insulating layer 108 and the buffer layer 103 in order from top to bottom.

Figure 13:
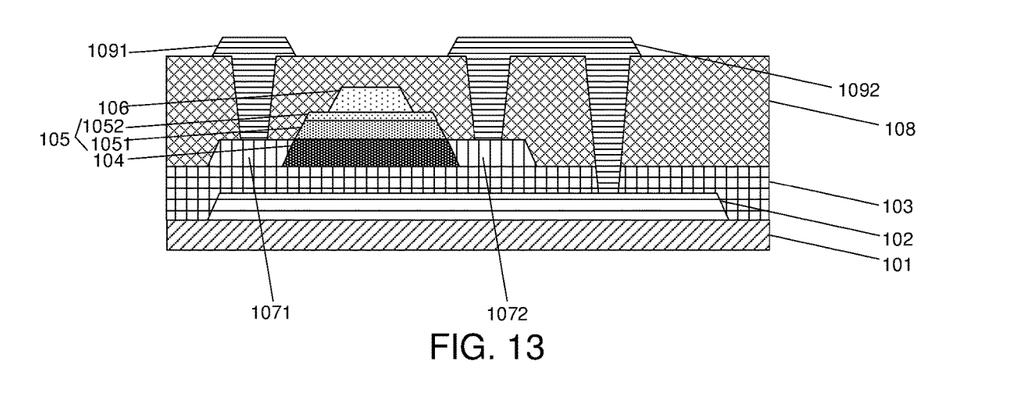
FIG. 13 is a schematic structural view showing a step S9 of the method of fabricating the thin film transistor substrate of FIG. 10.

S9, forming a source/drain metal layer 109 in the at least one via hole 112 is provided.

As shown in FIG. 13, a source/drain metal layer 109 is formed in the via hole 112. In this embodiment, the material of the source/drain metal layer 109 is one of molybdenum (Mo), aluminum (Al), copper (Cu), and titanium (Ti) an alloy. A thickness of the source/drain metal layer 109 ranges between 2000 angstroms and 8000 angstroms. The source/drain metal layer 109 includes a source metal layer 1092 and a drain metal layer 1091. The source metal layer 1092 is correspondingly deposited in the second via hole 1122 and the third via hole 1123, and the two bottom ends thereof are respectively connected to the upper surface of the conductor layer 107 and the light shielding layer 102. The top end of the source metal layer 1092 overflows the second via hole 1122 and the third via hole 1123, and is formed on the upper surface of the interlayer insulating layer 108. The drain metal layer 1091 is correspondingly deposited in the first via hole 1121, and the bottom end thereof is in contact with the upper surface of the conductor layer 107. The top end of the drain metal layer 1091 overflows the first via hole 1121 and is formed on the upper surface of the interlayer insulating layer 108.

Figure 14:
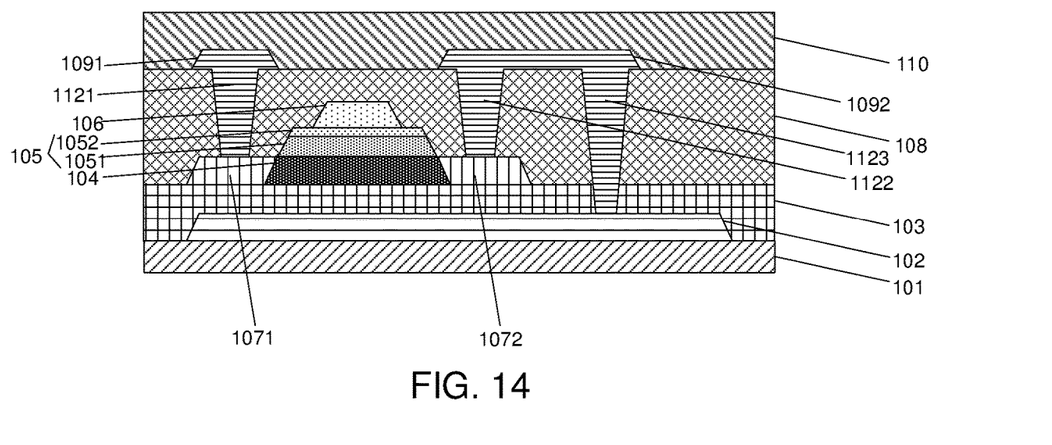
FIG. 14 is a schematic structural view showing a step S10 of the method of fabricating the thin film transistor substrate of FIG. 10.

S10, forming a passivation layer 110 on the source/drain metal layer 109 is provided.

As shown in FIG. 14, the passivation layer 110 is deposited on the upper surface of the interlayer insulating layer 108. The passivation layer 110 covers the upper surface of the interlayer insulating layer 108 and the upper surface of the source/drain metal layer 109. In the embodiment, the material of the passivation layer 110 is a combination of one or two of silicon oxide and silicon nitride, or a multilayer structure film, and the passivation layer 110 has a thickness of 1000 to 5000 angstroms. So far, the thin film transistor substrate has been completed.

Beneficial effects of an embodiment of the present disclosure are that, a thin film transistor substrate and a method of fabricating the same are provided. The gate insulating layer adopts a two-layer structure, one layer is a silicon oxide layer, and another layer is a silicon nitride layer. The silicon oxide layer is formed on the active layer, and the silicon nitride layer is formed on the silicon oxide layer. Hydrogen ions in the silicon nitride layer diffuse into the active layer, hindering trapping of electrons by the defect state, reducing influence of a bias stress on characteristics of the thin film transistor substrate, and improving reliability of the thin film transistor substrate. In addition, silicon nitride has a high dielectric constant, which can improve field effect mobility of the thin film transistor substrate.

In the above, although the present application has been disclosed in the above preferred embodiments, the preferred embodiments are not intended to limit the application, and those skilled in the art can make various modifications without departing from the spirit and scope of the application. The invention is modified and retouched, and the protection scope of the present application is determined by the scope defined by the claims.

What is claimed is:

1. A method of fabricating a thin film transistor substrate, comprising steps of:
   S1, providing a substrate, sequentially forming a light shielding layer, a buffer layer, and an active layer on the substrate;
   S2, forming a gate insulating layer on the active layer, wherein the gate insulating layer comprises a stacked structure comprising a first insulating layer and a second insulating layer, a thickness of the first insulating layer is not less than a thickness of the second insulating layer, and the second insulating layer is disposed on the first insulating layer;
   S3, sequentially forming a metal layer and a photoresist layer on the gate insulating layer;
   S4, etching the metal layer by using the photoresist layer as an occlusion to obtain a gate layer, and removing a portion of the metal layer that is not blocked by the photoresist layer;
   S5, etching the gate insulating layer by self-aligning the gate layer, and performing a conductor treatment, wherein the active layer not blocked by the gate insulating layer forms a conductor layer;
   S6, after the gate insulating layer is etched and the conductor treatment is completed, the photoresist layer is stripped;
   S7, forming an interlayer insulating layer on the gate layer;
   S8, opening at least one hole in the interlayer insulating layer and the buffer layer to form at least one via hole;
   S9, forming a source/drain metal layer in the at least one via hole; and
   S10, forming a passivation layer on the source/drain metal layer;

wherein the at least one via hole is formed by a yellow light process, the at least one via hole comprises a first via hole, a second via hole, and a third via hole, the first via hole is connected to a first conductor layer through the interlayer insulating layer, the second via hole is connected to a second conductor layer through the interlayer insulating layer, and the third via hole is connected to the light shielding layer through the interlayer insulating layer and the buffer layer sequentially.

2. The method according to claim 1, wherein the source/drain metal layer comprises a source metal layer and a drain metal layer, the source metal layer is formed in the second via hole and the third via hole, and the drain metal layer is formed in the first via hole.

3. The method according to claim 1, wherein the light shielding layer, the gate layer, and the source/drain metal layer are made of the same material which is at least one of molybdenum, aluminum, copper, and titanium, a thickness of the light shielding layer ranges between 500 angstroms and 2000 angstroms, the gate layer and the source/drain metal layer have the same thickness ranging between 2000 angstroms and 8000 angstroms, material of the active layer comprises a metal oxide semiconductor material, and a thickness of the active layer ranges between 100 angstroms and 1000 angstroms.

4. The method according to claim 1, wherein the buffer layer, the interlayer insulating layer, and the passivation layer are made of the same material which is at least one of silicon oxide and silicon nitride, a thickness of the interlayer insulating layer ranges between 2000 angstroms and 10000 angstroms, and the buffer layer and the passivation layer have the same thickness ranging between 1000 angstroms and 5000 angstroms.

* * * * *